United States Patent
Yuasa et al.

(10) Patent No.: US 9,449,439 B2
(45) Date of Patent: Sep. 20, 2016

(54) BATTERY STATE DISPLAY SYSTEM

(71) Applicant: NGK SPARK PLUG CO., LTD., Nagoya-shi, Aichi (JP)

(72) Inventors: Go Yuasa, Rancho Palos Verdes, CA (US); Michael J. Ramirez, West Hollywood, CA (US); Masashi Tsuzuki, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 0 days.

(21) Appl. No.: 14/817,663

(22) Filed: Aug. 4, 2015

(65) Prior Publication Data

US 2016/0071339 A1    Mar. 10, 2016

Related U.S. Application Data

(60) Provisional application No. 62/033,319, filed on Aug. 5, 2014.

(51) Int. Cl.
*G07C 5/08* (2006.01)
*G01R 31/36* (2006.01)
*B60L 11/18* (2006.01)

(52) U.S. Cl.
CPC .......... *G07C 5/0825* (2013.01); *B60L 11/1861* (2013.01); *G01R 31/3606* (2013.01); *G01R 31/3651* (2013.01); *G01R 31/3689* (2013.01)

(58) Field of Classification Search
CPC ............ G07C 5/0825; G01R 31/3634; G01R 31/3662; G01R 13/3679; G01R 31/3682; G01R 31/3686; G01R 31/3689
See application file for complete search history.

(56) References Cited

U.S. PATENT DOCUMENTS 6,181,991 B1 * 1/2001 Kondo ................ B60L 11/1816 701/1
2003/0236601 A1   12/2003 McLeod et al.
2006/0052918 A1   3/2006 McLeod et al.

FOREIGN PATENT DOCUMENTS

JP    2005-521170 A    7/2005

* cited by examiner

*Primary Examiner* — Curtis Odom
(74) *Attorney, Agent, or Firm* — Sughrue Mion, PLLC

(57) ABSTRACT

A battery state display system includes: a plurality of electric vehicles, each of the plurality of electric vehicles being configured to be driven by a battery containing battery fluid; and a display terminal. The display terminal includes: a communication unit configured to communicate with the plurality of electric vehicles; a display configured to display an image including a state of the battery of each of a plurality of electric vehicles on the display of the display terminal; and a processor configured to: control the display terminal to display on the display a battery state indication for each of the electric vehicles, the battery state indication including: a charge state indication representing a charge state of the battery; and a fluid amount indication relating to an amount of the battery fluid of the battery.

12 Claims, 14 Drawing Sheets

BATTERY STATE DISPLAY SYSTEM

This application claims benefit of U.S. Provisional Application No. 62/033,319 filed Aug. 5, 2014, incorporated herein by reference in its entirety.

FIELD OF THE INVENTION

The present invention relates to a battery state display system which displays states of batteries of a plurality of electric vehicles, on a display of a display terminal.

DESCRIPTION OF THE RELATED ART

Each of electric vehicles, such as golf carts used in a golf course or electric carts used in a facility such as a hospital or a city block for retired employees, includes an electric motor as a travelling drive source and a battery for supplying electric power to the motor. Thus, in golf courses and respective facilities, etc., it is desirable to manage states of batteries such as charge states of respective electric vehicles and suitably notify the battery states to a manager so that each of the electric vehicles does not become unable to travel due to exhaustion of the battery. For example, JP-A-2005-521170 discloses a management system for a vehicle which is enabled to monitor diagnostic data of the vehicle such as a charge state of a battery.

SUMMARY OF THE INVENTION

Problems that the Invention is to Solve

Lead batteries have been used in many cases as batteries for electric vehicles such as golf carts. One cause of deterioration of the lead battery is reduction of an amount of battery fluid due evaporation thereof. Thus, in a case of using the lead battery for an electric vehicle, it is necessary not only to charge the battery by monitoring a charge state and but also to periodically or suitably replenish the battery fluid so as to cope with reduction of an amount of the battery fluid.

The invention has been contrived bearing in mind the heretofore described circumstances, and an object of the invention is to provide a battery state display system including a display terminal which can display information relating to an amount of battery fluid as well as a charge state of a battery of each of electric vehicles.

According to an aspect of the invention, a battery state display system includes a display terminal having a display for displaying an image, and displays a state of a battery of each of a plurality of electric vehicles driven by the respective batteries on the display of the display terminal, wherein the display terminal includes a battery state display unit which displays on the display, for each of the electric vehicles, a battery state indication including a charge state indication representing a charge state of the battery and a fluid amount indication relating to an amount of battery fluid of the battery.

In the battery state display system, the display terminal includes the battery state display unit which displays the battery state indication including the charge state indication and the fluid amount indication, for each of the electric vehicles, on the display. By doing so, this system can display on the display terminal not only a charge state of the battery but also information relating to an amount of the battery fluid, for each of the electric vehicles.

In this manner, this system can suitably notify information relating to an amount of the battery fluid as well as a charge state of the battery, for each of the electric vehicles, to a manager and others by means of the display terminal. Thus, the manager can recognize the vehicle requiring charging of the battery based on the charge state indication of the battery state indication and can charge this battery suitably. Further, the manager can suitably replenish the battery fluid based on the fluid amount indication. As a result, deterioration of the battery due to reduction of an amount of the battery fluid can be prevented.

Typical examples of the electric vehicle are a golf cart used in a golf course and an electric cart used in a facility such as a hospital or an amusement park or a city block for a retired employee. Further, typical examples of the display terminal are a portable tablet terminal, a portable smartphone, a desktop type PC terminal and a notebook type PC terminal.

The charge state indication and the fluid amount indication may be displayed separately or in a partially overlapped manner. Alternatively, the charge state indication and the fluid amount indication may be integrated and displayed as the single battery state indication.

A typical example of a display mode of the charge state indication is a numerical value indication which represents a state of charge (SOC) of the battery by a numerical value. Alternatively, the charge state indication may be an indication which is represented visually by an image or a graphic such as a level indicator, that shows the charge state (SOC) of the battery in a manner that respective levels thereof are represented by different colors or sizes so that a manager can recognize the charge state of the battery at a glance. Specifically, an example of such the charge state indication is an icon designed based on a battery so as to represent respective levels of the charge state by different colors.

A typical example of a display mode of the fluid amount indication is an indication representing a level of an amount of the battery fluid such as a numerical value indication which represents, by a numerical value, an amount of the battery fluid detected using a fluid amount sensor. Another typical example of a display mode of the fluid amount indication is a graphic which represents an amount of the battery fluid in plural levels.

Further, another typical example of a display mode of the fluid amount indication is an indication, relating to necessity/unnecessity of replenishment of the battery fluid, such as a message or an alarm mark for urging replenishment of the battery fluid in a case that replenishment of the battery fluid is necessary. Incidentally, as a method of determining the fluid amount and the necessity/unnecessity of replenishment of the battery fluid, as well as a method of performing this determination based on a detected amount of the battery fluid using the fluid amount sensor, a method of performing this determination based on an elapsed time after the most recent replenishment date/time of the battery fluid may be adopted. Alternatively, a method of performing the determination in view of further information such as a battery temperature or an ambient temperature in addition to the elapsed time may be adopted.

Further, as an example of the battery state indication configured by integrating the charge state indication and the fluid amount indication, there is a level indicator which simultaneously indicates a level of the charge state and a level of the fluid amount.

In the aforesaid battery state display system, preferably, each of the electric vehicles includes an SOC information acquisition unit which acquires SOC information relating to the charge state of the electric vehicle, and a radio transmission unit which transmits the SOC information by radio communication. The battery state display unit, preferably, displays the charge state indication based on the SOC information.

In this battery state display system, each of the electric vehicles includes the SOC information acquisition unit and the radio transmission unit and transmits the acquired SOC information by radio communication. The display terminal displays the charge state indication based on the transmitted SOC information. In this manner, this system can suitably display the charge state indications based on respective SOC information of the electric vehicles scattered at various places.

In order for the display terminal to acquire the SOC information, the display terminal may directly receive the SOC information of each of the electric vehicles by radio communication. Further, the display terminal may indirectly acquire the SOC information of one of the electric vehicles via another of the electric vehicles by means of radio communication between these electric vehicles in addition to radio communication between the display terminal and the another electric vehicle.

Alternatively, the system may be arranged to include a base station which performs radio communication directly with each of the electric vehicles or indirectly therewith via another of the electric vehicles, and then transfers SOC information of each of the electric vehicles received thereby to the display terminal.

Preferably, the aforesaid battery state display system further includes a fluid amount information acquisition unit which acquires, for each of the electric vehicles, fluid amount information relating to an amount of battery fluid, and the battery state display unit displays the fluid amount indication based on the fluid amount information.

In this manner, the battery state display system includes the fluid amount information acquisition unit and the display terminal displays the fluid amount indication of the battery state indication based on the fluid amount information. Thus, this system can suitably display the fluid amount indication based on the fluid amount information on the display of the display terminal.

In the aforesaid battery state display system, preferably, the fluid amount information acquisition unit includes a necessity/unnecessity information acquisition unit which acquires necessity/unnecessity information representing replenishment necessity or replenishment unnecessity of the battery fluid as the fluid amount information. The battery state display unit preferably displays, based on the necessity/unnecessity information, a fluid replenishment necessity indication representing the replenishment necessity of the battery fluid or a fluid replenishment unnecessity indication representing the replenishment unnecessity of the battery fluid, as the fluid amount indication, for each of the electric vehicles.

In this manner, this battery state display system acquires the necessity/unnecessity information and displays the fluid replenishment necessity indication or the fluid replenishment unnecessity indication for each of the electric vehicles. Thus, a manager can easily recognize the vehicle requiring replenishment of the battery fluid.

As described above, an example of the fluid replenishment necessity indication is the message or the mark urging replenishment of the battery fluid. An example of the mark urging the replenishment is an image (fluid droplet mark) designed based on a fluid droplet as a motif.

As the fluid replenishment unnecessity indication, an image designed so as to be discriminable from the fluid replenishment necessity indication may be separately displayed. Alternatively, an image not indicating the fluid replenishment necessity indication may be used as the fluid replenishment unnecessity indication.

As methods of generating the necessity/unnecessity information of the replenishment necessity and the replenishment unnecessity, there are a method of generating the necessity/unnecessity information using a signal from a fluid amount sensor which discriminates an amount of the battery fluid using binary data; a method of detecting an amount of the battery fluid using a fluid amount sensor or the like and determining whether or not the detected fluid amount is lower than a reference value; and a method of determining whether or not a predetermined time elapses from date/time at which the battery fluid is replenished most recently.

In the aforesaid battery state display system, preferably, the fluid amount information acquisition unit includes a time elapse determination unit which sets the necessity/unnecessity information to the replenishment necessity in a case that a predetermined first time period elapses after date/time at which the battery fluid is replenished most recently as to the electric vehicle, whilst sets the necessity/unnecessity information to the replenishment unnecessity in a case that the predetermined first time period does elapse yet.

According to this battery state display system, the necessity/unnecessity (replenishment necessity or replenishment unnecessity) of replenishment of the battery fluid is determined depending on whether or not the predetermined first time period elapses after the most recent replenishment date/time of the battery fluid. By doing so, the necessity/unnecessity of replenishment of the battery fluid can be determined easily without providing a sensor or the like for detecting an amount of the battery fluid for each of the electric vehicles.

In the aforesaid battery state display system, preferably, the fluid amount information acquisition unit includes a level information acquisition unit which acquires level information representing an amount of the battery fluid as the fluid amount information, for each of the electric vehicles. The battery state display unit, preferably, includes a fluid amount level display unit which displays, based on the level information, a fluid amount level indication representing a level of an amount the battery fluid as the fluid amount indication, for each of the electric vehicles.

According to this battery state display system, as the fluid amount level indication is displayed as the fluid amount indication, the display terminal can easily notify a level of an amount the battery fluid for each of the electric vehicles to a manager.

Embodiments according to the invention will be explained with reference to drawings.

Figure 1:
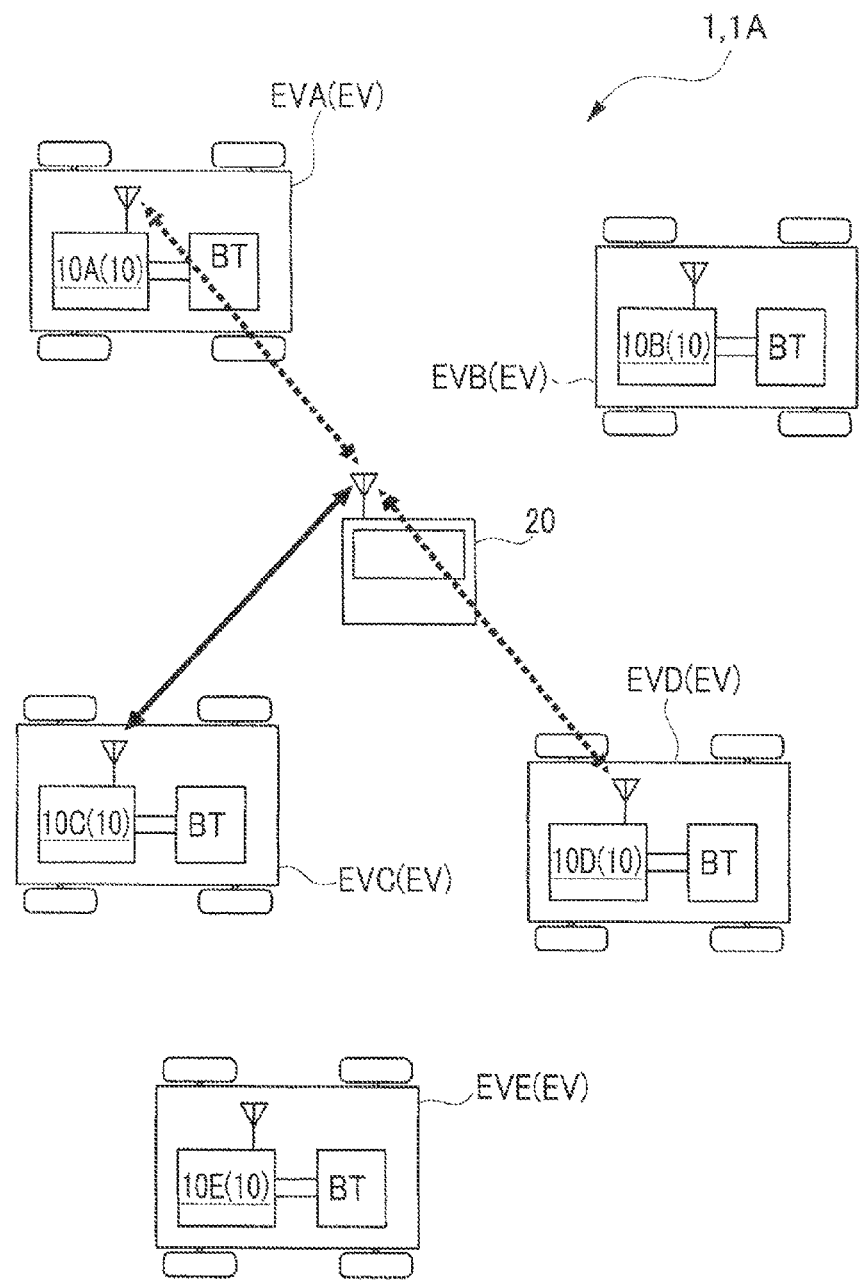
FIG. 1 is an explanatory diagram showing configuration of a cart information display system (battery state display system) according to an embodiment.
Figure 2:
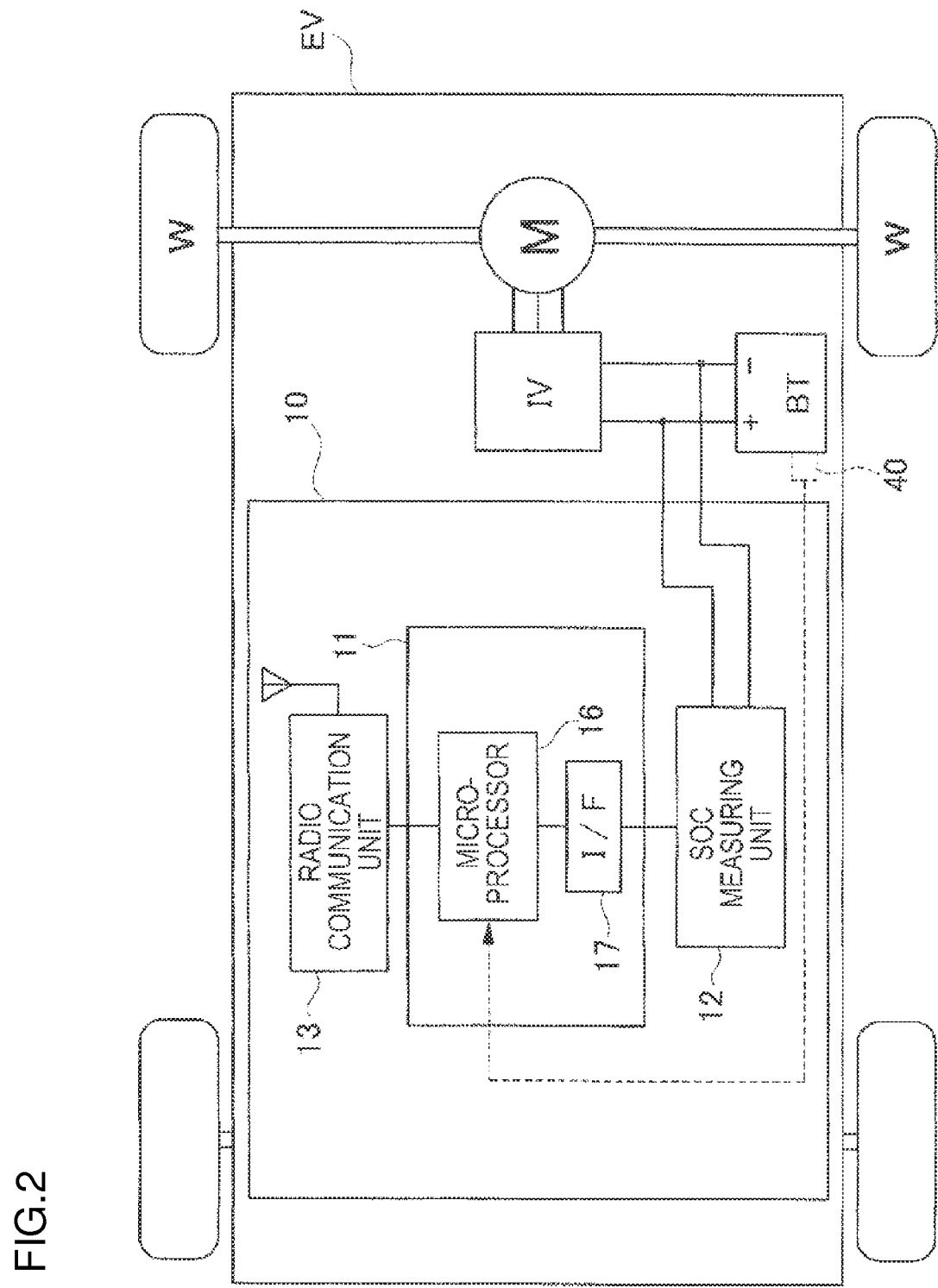
FIG. 2 is an explanatory diagram showing schematic configuration of a cart (electric vehicle) according to the embodiment.
Figure 3:
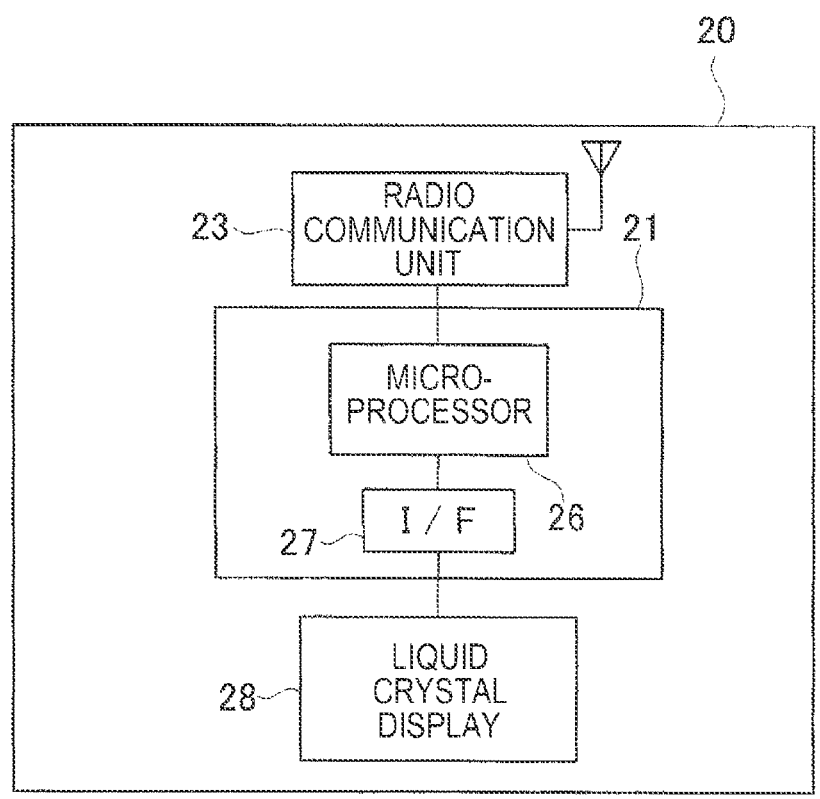
FIG. 3 is an explanatory diagram showing schematic configuration of a tablet terminal (display terminal) according to the embodiment.

FIG. 1 shows a cart information display system 1 as a battery state display system according to the embodiment. FIG. 2 shows schematic configuration of a cart EV as an electric vehicle according to the embodiment, and FIG. 3 shows schematic configuration of a tablet terminal 20 as a display terminal according to the embodiment.

Each of the cart EVs (EVA, EVB, - - - ) shown in FIGS. 1 and 2 is an electric vehicle used in a golf course and includes an electric motor M for driving drive wheels W, an inverter IV for converting a DC voltage into an AC voltage and a battery BT for supplying electric power to the motor M via the inverter IV. Each of the cart EVs further mounts an in-vehicle diagnostic unit 10 (10A, 10B, - - - ) for performing diagnosis of a state of charge (SOC) of the battery BT, and so on. The tablet terminal 20 shown in FIG. 3 is a portable tablet terminal on the market having a liquid crystal display 28 as a display.

The cart information display system 1 (hereinafter also simply called as the system 1) shown in FIG. 1 is a system which displays for each of the cart EVs, on the liquid crystal display 28 of the tablet terminal 20, diagnostic information such as a charge state (SOC) of the battery BT diagnosed in each of the in-vehicle diagnostic units 10 (10A, 10B, 10C, 10D, 10E, - - - ) of the cart EVs (EVA, EVB, EVC, EVD, EVE, - - - ) within the golf course. Although FIG. 1 shows five cart EVs (EVA, EVB, EVC, EVD, EVE), the system 1 according to the embodiment contains nine cart EVs in total including not-shown cart EVs within the system 1.

The in-vehicle diagnostic unit 10 (see FIG. 2) mounted in the cart EV includes a main circuit unit 11, an SOC measuring unit 12 and a radio communication unit 13. The main circuit unit 11 includes a microprocessor 16 and an interface circuit 17 connected to a bus of the microprocessor 16. The SOC measuring unit 12 is connected to the bus of the microprocessor 16 via the interface circuit 17. The radio communication unit 13 is also connected to a bus of the microprocessor 16.

The SOC measuring unit 12 is connected to the battery BT of the cart EV. The SOC measuring unit measures with a constant period (specifically every 3 minutes) a charge state (SOC) of the battery BT, specifically, an open circuit voltage (OCV) of the battery BT corresponding to the SOC as diagnostic information relating to the cart EV mounting the in-vehicle diagnostic unit 10.

The radio communication unit 13 performs radio communication with the tablet terminal 20 according to predetermined communication standard and transmits information (SOC information) of a charge state (SOC) measured by the SOC measuring unit 12.

The tablet terminal 20 (see FIG. 3) includes the liquid crystal display 28, a main circuit unit 21 and a radio communication unit 23. The main circuit unit 21 includes a microprocessor 26 and an interface circuit 27 connected to a bus of the microprocessor 26. The interface circuit 27 is configured by a display LSI, and so on. The liquid crystal display 28 is connected to the bus of the microprocessor 26 via the interface circuit 27.

The radio communication unit 23 performs radio communication with the in-vehicle diagnostic unit 10 (radio communication unit 13) of each of the cart EVs according to the predetermined communication standard and receives SOC information.

In this manner, the tablet terminal 20 obtains SOC information of each of the cart EVs by the radio communication.

Next, explanation will be made as to information of the respective cart EVs displayed on the liquid crystal display 28 of the tablet terminal 20.

Figure 4:
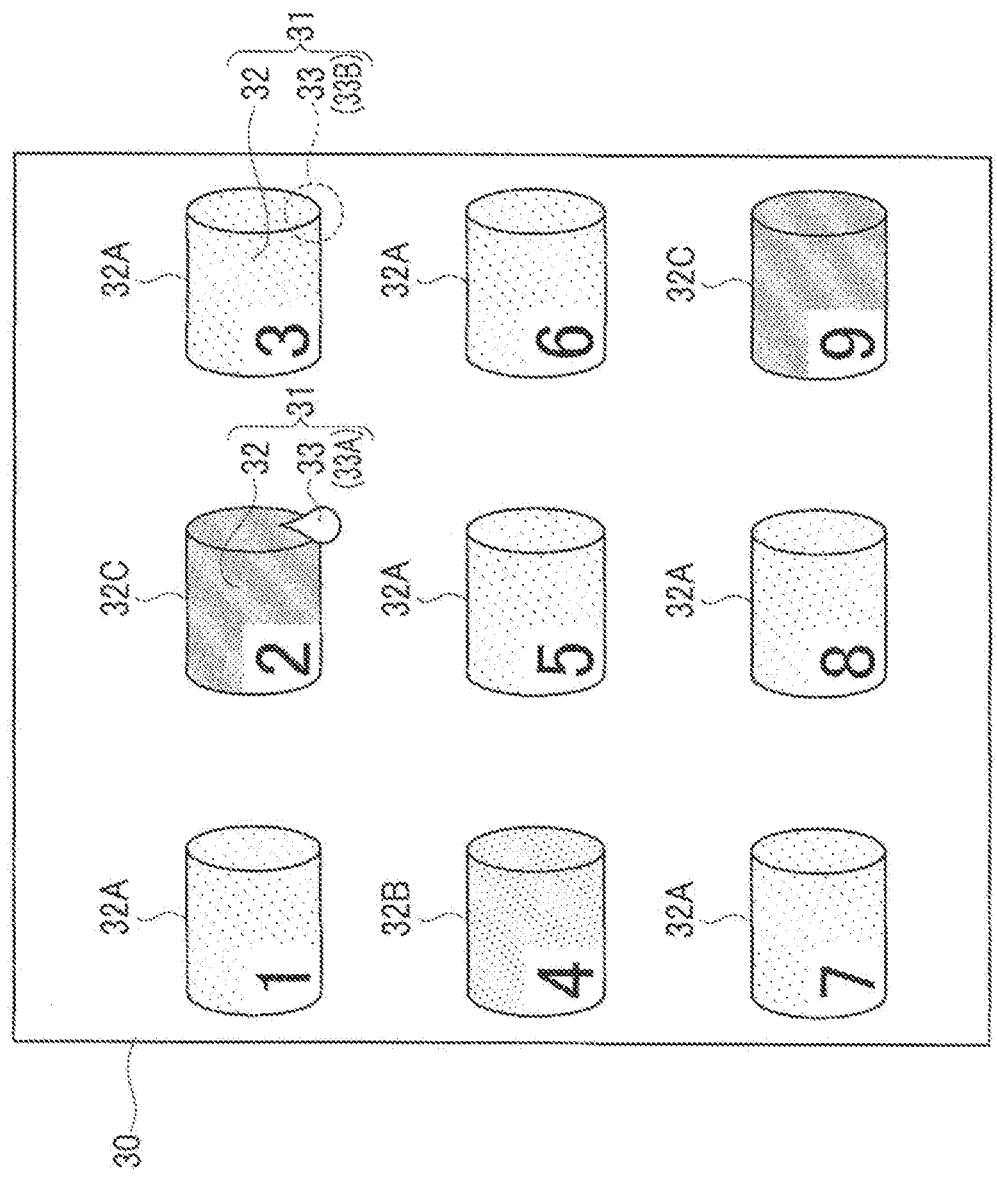
FIG. 4 is an explanatory diagram showing configuration of a display screen displayed on a liquid crystal display (display) of the tablet terminal according to the embodiment.

FIG. 4 shows configuration of the display screen 30 displayed on the liquid crystal display 28 (display) of the tablet terminal 20 according to the embodiment.

The display screen 30 displays, for each of the nine cart EVs within the system 1, a battery state indication 31 configured by a charge state indication 32 representing a charge state (SOC) of the battery BT and a fluid amount indication 33 relating to an amount of the battery fluid of the battery BT.

The charge state indication 32 is an image (icon) designed based on a battery as a motif. The charge state indication is drawn by using different colors according to respective levels of a charge state (SOC) of the battery BT based on SOC information obtained by the radio communication with the corresponding cart EV. Specifically, respective levels of a charge state (SOC) are shown by three different colors in a manner that a level in a range from more than 70% to 100% (full charge) is drawn by the image of green (32A), a level in a range from 40% to 70% is drawn by the image of yellow (32B) and a level less than 40% is drawn by the image of red (32C).

The fluid amount indication 33 represents whether or not replenishment of the battery fluid of the battery BT is necessary. Specifically, in a case that the battery fluid is required to be replenished, a fluid droplet mark (33A), designed based on a fluid droplet as a motif, is displayed in a partially overlapped manner at a lower right portion of the charge state indication 32 so as to urge replenishment of the battery fluid. On the other hand, in a case that the battery fluid is not required to be replenished, a fluid replenishment unnecessity indication 33B of transparent color is displayed. That is, the fluid droplet mark is not displayed (transmission display) in this case.

In a case of displaying the fluid droplet mark as the fluid amount indication 33, it is necessary to determine whether or not replenishment of the battery fluid is necessary, for each of the cart EVs. In view of this, in the system 1, when a replenishment worker replenishes the battery fluid in the battery BT of each of the cart EVs, the replenishment worker performs an input operation of completion of the replenishment of the battery fluid using a touch panel of the tablet terminal 20. By doing so, the tablet terminal 20 updates and stores replenishment date/time by using this input timing as most recent replenishment date/time, for each of the cart EVs. The tablet terminal 20 computes, for each of the cart EVs, an elapsed time after the most recent replenishment date/time and determines that the replenishment of the battery fluid is necessary when a predetermined first time period (for example, 20 days) elapses after the most recent replenishment date/time. In contrast, the tablet terminal determines that the replenishment of the battery fluid is not necessary when the first time period does not elapse yet.

Next, detailed explanation will be made with reference to FIG. 5 as to an operation of the in-vehicle diagnostic unit 10 of each of the cart EVs constituting the cart information display system 1.

Figure 5:
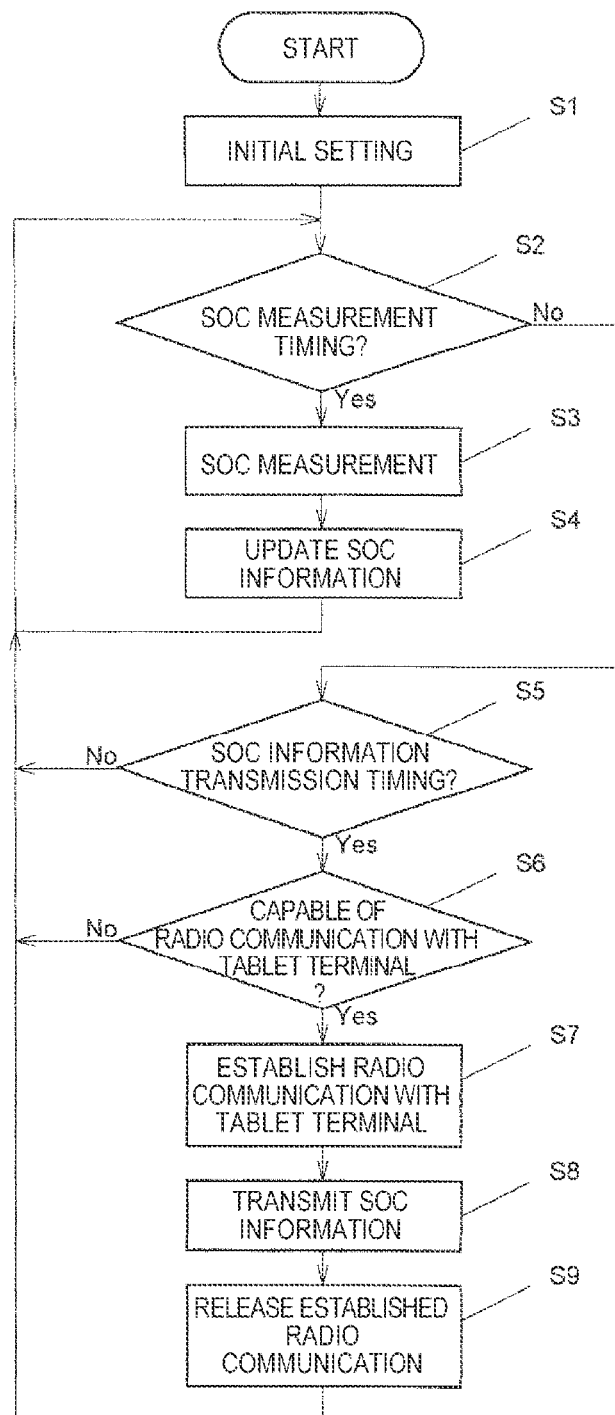
FIG. 5 is a flowchart showing a processing operation of a microprocessor of an in-vehicle diagnostic unit mounted in the cart according to the embodiment.

FIG. 5 is a flowchart showing an operation relating to acquisition of SOC information in the microprocessor 16 of the in-vehicle diagnostic unit 10.

When the microprocessor 16 starts its operation, firstly initial setting necessary for the radio communication unit 13, etc. is performed in step S1.

Then, in step S2, it is determined whether or not a timing of SOC measurement to be performed at every predetermined constant period (3 minutes in this embodiment) has arrived. When it is determined that the SOC measurement timing has arrived (Yes), the processing proceeds to step S3. In contrast, when it is determined that the SOC measurement timing has not arrived yet (No), the processing proceeds to step S5.

In step S3, a charge state (SOC) of the battery BT of the cart EV mounting the in-vehicle diagnostic unit 10 is measured using the SOC measuring unit 12. Specifically, the SOC measuring unit measures an open circuit voltage (OCV) of the battery BT to estimate a corresponding SOC from the measured OCV.

Next, in step S4, SOC information is updated using the estimated SOC value thus obtained. When step S4 terminates, the processing returns to step S2. In this manner, SOC measurement of the battery BT is performed with the constant period (every 3 minutes).

In contrast, when the determination is made No in step S2 and the processing proceeds to step S5, it is determined whether or not a timing of transmission of SOC information to be performed at every predetermined constant period (5 minutes in this embodiment) has arrived. When it is determined that the transmission timing of SOC information has arrived (Yes), the processing proceeds to step S6. In contrast, when it is determined that the transmission timing of SOC information has not arrived yet (No), the processing returns to step S2.

In step S6, it is confirmed whether or not radio communication is capable with the tablet terminal 20. When radio communication is capable with the tablet terminal 20 (Yes), the processing proceeds to step S7. In contrast, when radio communication cannot be performed with the tablet terminal 20 (No), the processing returns to step S2.

In step S7, radio communication is established with the tablet terminal 20, and SOC information is transmitted to the tablet terminal 20 in succeeding step S8. The tablet terminal 20 stores the SOC information thus transmitted, for each of the cart EVs.

Then, the processing proceeds to step S9, in which the established radio communication is released. Then, the processing returns to step S2, and the processing of step 2 and the succeeding steps are repeated.

In this manner, SOC information of each of the cart EVs is transmitted to and stored in the tablet terminal 20.

Next, an operation of the tablet terminal 20 will be explained in detail with reference to FIGS. 6 to 9.

Figure 6:
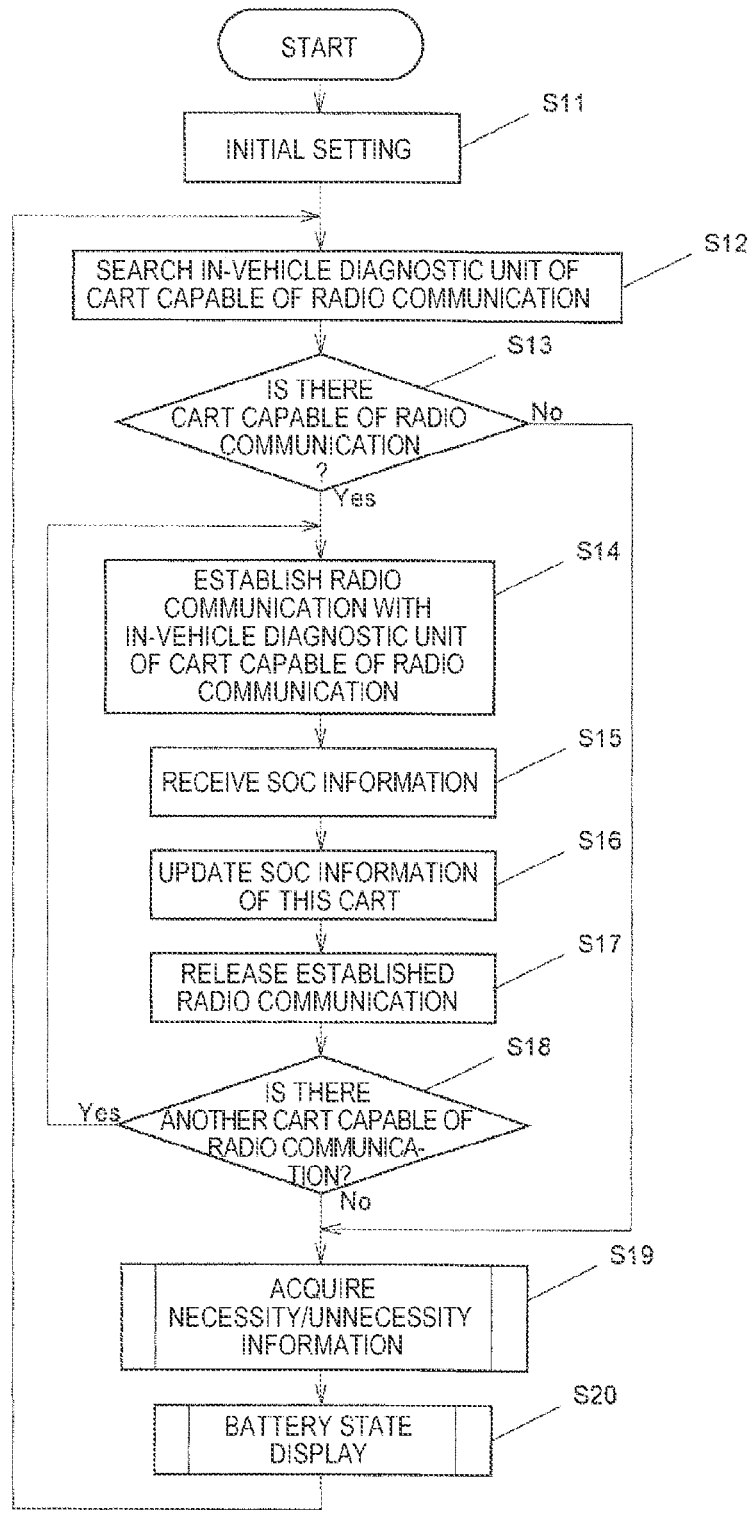
FIG. 6 is a flowchart showing a processing operation of a microprocessor of the tablet terminal according to the embodiment.

FIG. 6 is a flowchart showing an operation relating to the battery state indication in the microprocessor 26 of the tablet terminal 20.

When the microprocessor 26 starts its operation, firstly initial setting of the radio communication unit 23 is performed in step S11.

Then, the processing proceeds to step S12, in which searching is performed as to the radio communication unit 13 of the in-vehicle diagnostic unit 10 of the cart EV capable of radio communication with the radio communication unit 23 of the tablet terminal.

Next, in step S13, it is determined based on the search result in step S12 whether or not there is the cart EV (the radio communication unit 13 of the in-vehicle diagnostic unit 10) capable of radio communication. When there is the cart EV capable of radio communication (Yes), the processing proceeds to step S14. In contrast, when there is no cart EV capable of radio communication (No), the processing proceeds to step S19.

In step S14, radio communication is established with the radio communication unit 13 of the in-vehicle diagnostic unit 10 of the cart EV capable of radio communication.

Next, the processing proceeds to step S15, in which SOC information of the cart EV mounting the in-vehicle diagnostic unit 10 established radio communication is received. Then, in succeeding step S16, SOC information of this cart EV stored in the tablet terminal 20 is updated using the SOC information thus received.

Next, the processing proceeds to step S17, in which the established radio communication is released.

In succeeding step S18, it is confirmed based on the search result in step S12 whether or not there is another cart EV (the radio communication unit 13 of the in-vehicle diagnostic unit 10) capable of radio communication. When there is another cart EV capable of radio communication (Yes), the processing returns to step S14. In contrast, when there is not any other cart EV capable of radio communication (No), the processing proceeds to step S19.

In step S19, a necessity/unnecessity information acquisition routine described later is executed. Further, in succeeding step S20, a battery state display routine described later is executed. Then, the processing returns to step S12, and the processing of step S12 and the succeeding steps are repeated.

Figure 7:
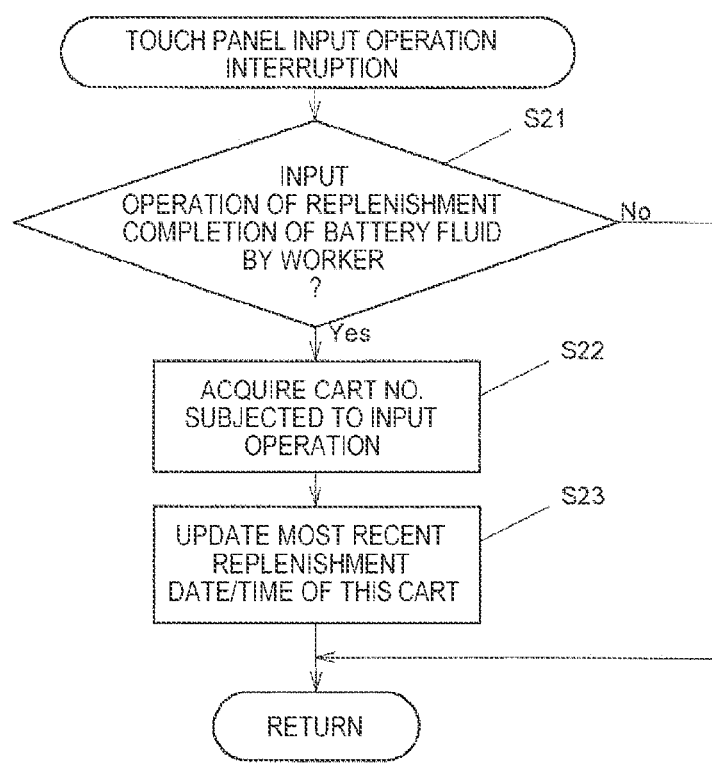
FIG. 7 is a flowchart showing an input operation interruption routine of a touch panel in the processing operation of the microprocessor of the tablet terminal according to the embodiment.

Next, an input operation interruption routine of the touch panel shown in FIG. 7 will be explained, as one of the operations performed by the microprocessor 26 of the tablet terminal 20. When a worker performs an input operation of the touch panel, this interruption routine is executed and the processing proceeds to step S21.

In step S21, it is determined whether or not the input operation of the touch panel by the worker is an input operation representing completion of the replenishment of the battery fluid. When the input operation represents completion of the replenishment of the battery fluid (Yes), the processing proceeds to step S22. In contrast, when the input operation is another input operation (No), this interruption routine is terminated.

In step S22, a cart No. of the cart EV subjected to the input operation, that is, the cart EV as to which the replenishment of the battery fluid has been completed, is acquired.

Next, the processing proceeds to step S23, in which the most recent replenishment date/time of this cart EV, which cart No. is thus obtained, is updated and then this interruption routine is terminated.

In this manner, the most recent replenishment date/time of the cart EV, as to which the replenishment of the battery fluid has been completed, is updated.

Figure 8:
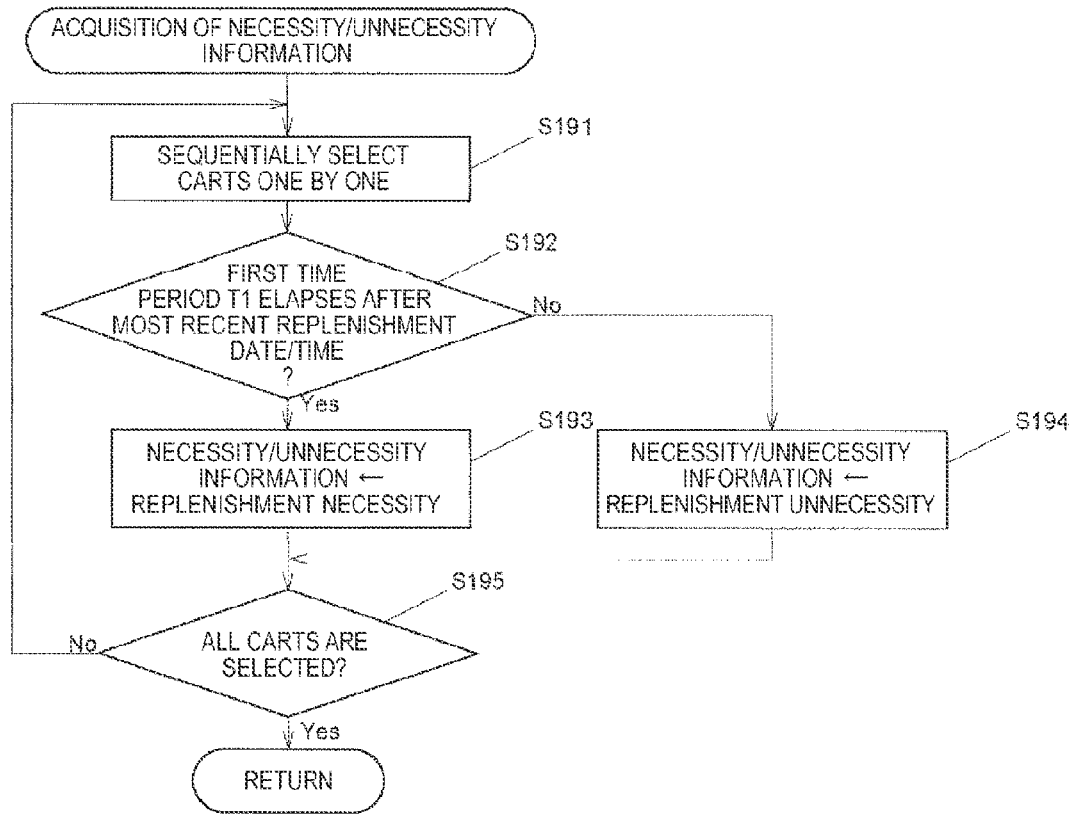
FIG. 8 is a flowchart showing a necessity/unnecessity information acquisition routine in the processing operation of the microprocessor of the tablet terminal according to the embodiment.

Next, the necessity/unnecessity information acquisition routine of step S19 in FIG. 6 will be explained with reference to FIG. 8.

Firstly, in step S191, the cart EVs are sequentially selected one by one.

Next, in step S192, it is determined as to the selected cart EV whether or not the first time period T1 (20 days) elapses from the most recent replenishment date/time to the current time. When the first time period T1 elapses (Yes), the processing proceeds to step S193, in which the necessity/unnecessity information is set to replenishment necessity. In contrast, when the first time period T1 does not elapse (No), the processing proceeds to step S194, in which the necessity/unnecessity information is set to replenishment unnecessity.

Then, in each of step S193 and S194, the processing proceeds to step S195, in which it is determined whether or not all the cart EVs are selected. When all the cart EVs are not selected (No), the processing returns to step S191, and the processing of step 191 and the succeeding steps are repeated. In contrast, when all the cart EVs are selected (Yes), this necessity/unnecessity information acquisition routine is terminated and the processing proceeds to step S20 of FIG. 6.

Figure 9:
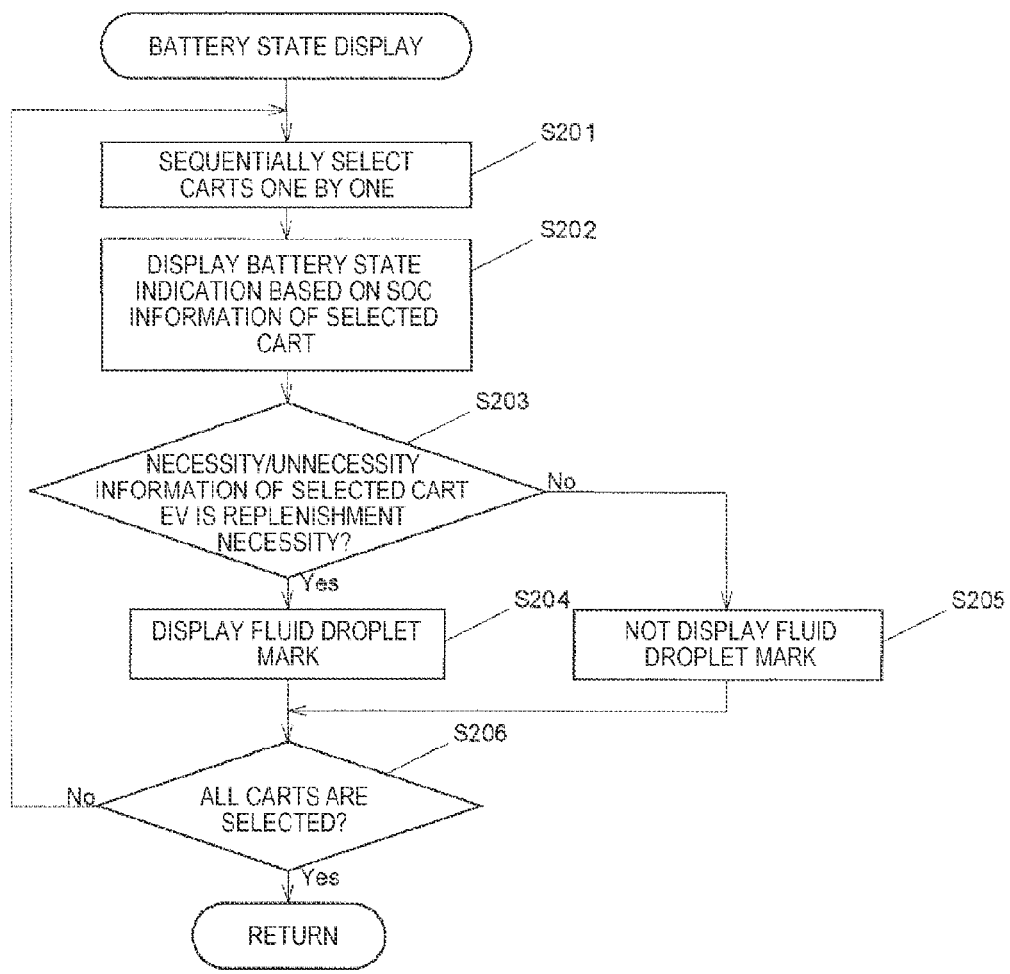
FIG. 9 is a flowchart showing a battery state display routine in the processing operation of the microprocessor of the tablet terminal according to the embodiment.

Next, the battery state display routine of step S20 in FIG. 6 will be explained with reference to FIG. 9.

Firstly, in step S201, the cart EVs are sequentially selected one by one.

Next, in step S202, the charge state indication 32 of the battery state indication 31 of the selected cart EV is displayed on the display screen 30 of the liquid crystal display 28 based on SOC information of the selected cart EV. That is, the charge state indication 32 of the image of corresponding one of green, yellow and red is displayed based on the SOC information. When the SOC information of the selected cart EV is not stored, the charge state indication 32 of the image of gray is displayed.

Next, in step S203, it is determined whether the necessity/unnecessity information of the selected cart EV is replenishment necessity or replenishment unnecessity. When the necessity/unnecessity information is replenishment necessity (Yes), the processing proceeds to step S204. In this step, the fluid droplet mark (fluid replenishment necessity indication 33A) is displayed as the fluid amount indication 33 in a partially overlapped manner at the lower right portion of the charge state indication 32. In contrast, when the necessity/unnecessity information is replenishment unnecessity (No), the processing proceeds to step S205. In this step, as the fluid amount indication 33 (fluid replenishment unnecessity indication 33B), the fluid droplet mark is not displayed (transmission display).

Then, in each of step S204 and S205, the processing proceeds to step S206, in which it is determined whether or not all the cart EVs are selected. When all the cart EVs are not selected (No), the processing returns to step S201, and the processing of step 201 and the succeeding steps are repeated. In contrast, when all the cart EVs are selected (Yes), this battery state display routine is terminated and the processing returns to step S12 of FIG. 6.

In this embodiment, the SOC measuring unit 12 of the in-vehicle diagnostic unit 10 and the microprocessor 16 of the in-vehicle diagnostic unit 10 executing steps S3 to S4 correspond to an SOC information acquisition unit. The radio communication unit 13 of the in-vehicle diagnostic unit 10 and the microprocessor 16 of the in-vehicle diagnostic unit 10 executing step S8 correspond to a radio transmission unit.

The microprocessor 26 of the tablet terminal 20 executing step S19 (necessity/unnecessity information acquisition routine) and step S23 corresponds to a fluid amount information acquisition unit and a necessity/unnecessity information acquisition unit. In these units, the microprocessor 26 executing steps S191 to S194 corresponds to a time elapse determination unit.

The microprocessor 26 of the tablet terminal 20 executing step S20 (battery state display routine) corresponds to a battery state display unit.

As described above, in the cart information display system 1 according to the embodiment; the tablet terminal 20 (display terminal) includes the battery state display unit (battery state display routine: step S20) which displays the battery state indication 31, including the charge state indication 32 showing a charge state and the fluid amount indication 33 relating to an amount of the battery fluid, for each of the cart EVs on the liquid crystal display 28 (display). By doing so, in this system 1, the tablet terminal 20 can display not only a charge state of the battery BT but also information relating to an amount of the battery fluid, for each of the cart EVs.

In this manner, in the system 1, information relating to an amount of the battery fluid as well as a charge state of the battery BT can be suitably notified, for each cart EV, to a manager and others trough the tablet terminal 20. Thus, the manager can recognize the cart EV requiring charging of the battery BT based on the charge state indication 32 of the battery state indication 31 and can charge this battery BT suitably. Further, the manager can suitably replenish the battery fluid based on the fluid amount indication 33. As a result, deterioration of the battery due to reduction of an amount of the battery fluid can be prevented.

Further, in the cart information display system 1 according to the embodiment, each of the cart EVs includes the SOC information acquisition unit (the SOC measuring unit 12 of the in-vehicle diagnostic unit 10, steps S3 to S4) and the radio transmission unit (the radio communication unit 13 of the in-vehicle diagnostic unit 10, step S8), and transmits obtained SOC information by radio communication. The tablet terminal 20 (display terminal) displays the charge state indication 32 based on transmitted SOC information. Thus, the system 1 can suitably display the charge state indications 32 based on respective SOC information of the cart EVs scattered at various places.

Further, the cart information display system 1 according to the embodiment includes the fluid amount information acquisition unit (step S19 and step S23). The tablet terminal 20 displays the fluid amount indications 33 of the battery state indications 31 based on respective fluid amount information. Thus, the system 1 can suitably display the fluid amount indications 33 on the liquid crystal display 28 of the tablet terminal 20 based on respective fluid amount information.

Furthermore, the cart information display system 1 according to the embodiment acquires necessity/unnecessity information and displays the fluid replenishment necessity indication 33A (fluid droplet mark) or the fluid replenishment unnecessity indication 33B (not displaying the fluid droplet mark (transmission display)) for each of the cart EVs. By doing so, the manager can easily recognize the cart EV requiring replenishment of the battery fluid.

Furthermore, the cart information display system 1 according to the embodiment determines necessity/unnecessity of replenishment of the battery fluid (replenishment necessity or replenishment unnecessity) based on whether the predetermined first time period (20 days in this embodiment) elapses after the most recent replenishment date/time. By doing so, as it is not necessary to provide a sensor or the like for detecting an amount of the battery fluid for each of the cart EVs, necessity/unnecessity of replenishment of the battery fluid can be determined easily.

MODIFIED EMBODIMENT

Next, a modified embodiment of the aforesaid embodiment will be explained with reference to accompanying drawings.

Like the cart information display system 1 according to the aforesaid embodiment, a cart information display system 1A according to the modified embodiment contains nine cart EVs (electric vehicles) in total including not-shown cart EVs within the system 1A in addition to the cart EVs (EVA, EVB, - - -) shown in FIG. 1. In the modified embodiment, the cart EV shown in FIG. 2 acquires SOC information of the battery BT using the SOC measuring unit 12. However, unlike the aforesaid embodiment, the cart EV acquires level information representing a level of an amount of the battery fluid of the battery BT as the fluid amount information, using a fluid amount sensor 40 shown by a dotted line in FIG. 2.

Further, the tablet terminal 20 acquires SOC information and level information for each of the cart EVs by radio communication.

Figure 10:
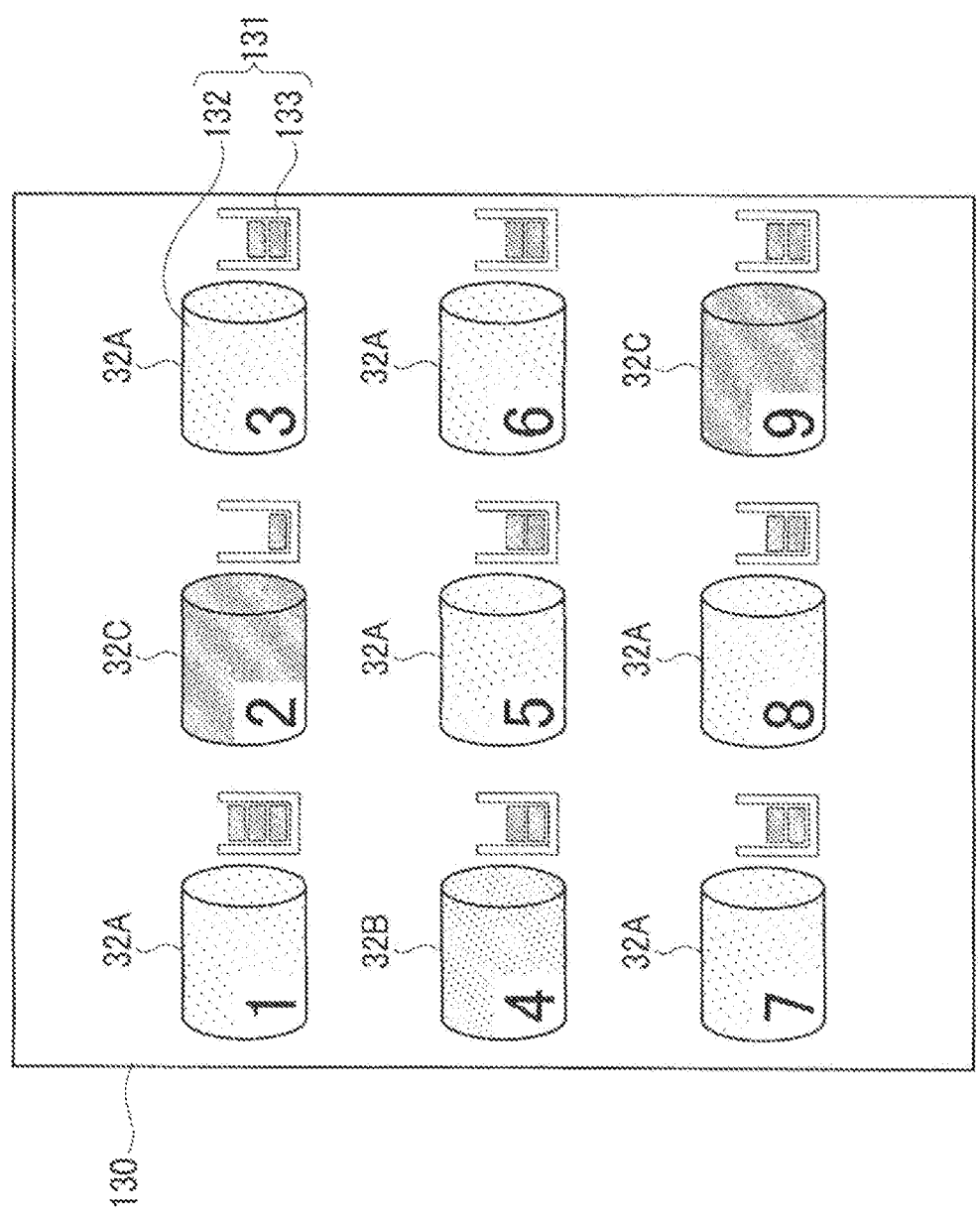
FIG. 10 is an explanatory diagram showing configuration of a display screen of a tablet terminal according to a modified embodiment.

FIG. 10 shows configuration of a display screen 130 displayed on the liquid crystal display 28 of the tablet terminal 20 according to the modified embodiment.

Like the aforesaid embodiment, the display screen 130 displays, for each of the nine cart EVs within the system 1A, a battery state indication 131 configured by a charge state indication 132 and a fluid amount indication 133.

Like the charge state indication 32 of the aforesaid embodiment, the charge state indication 132 is an image (icon) which is designed based on a battery as a motif and represents respective levels of a charge state (SOC) of the corresponding battery BT by three different colors.

Unlike the fluid amount indication 33 (fluid droplet mark) of the aforesaid embodiment, the fluid amount indication 133 is an image (vessel mark) designed so as to represent one of plural discrete levels corresponding to an amount of the battery fluid within the vessel. This fluid amount indication is always displayed on the right side of the charge state indication 132.

The tablet terminal 20 obtains by radio communication, for each of the cart EVs, level information acquired by the fluid amount sensor 40 together with SOC information. Then, the tablet terminal displays, as the fluid amount indication 133, the image of the fluid amount level indication (vessel mark) representing a corresponding level of an amount of the battery fluid based on the level information thus obtained.

Next, an operation of the in-vehicle diagnostic unit 10 of the cart EV according to the modified embodiment will be explained with reference to FIG. 11.

Figure 11:
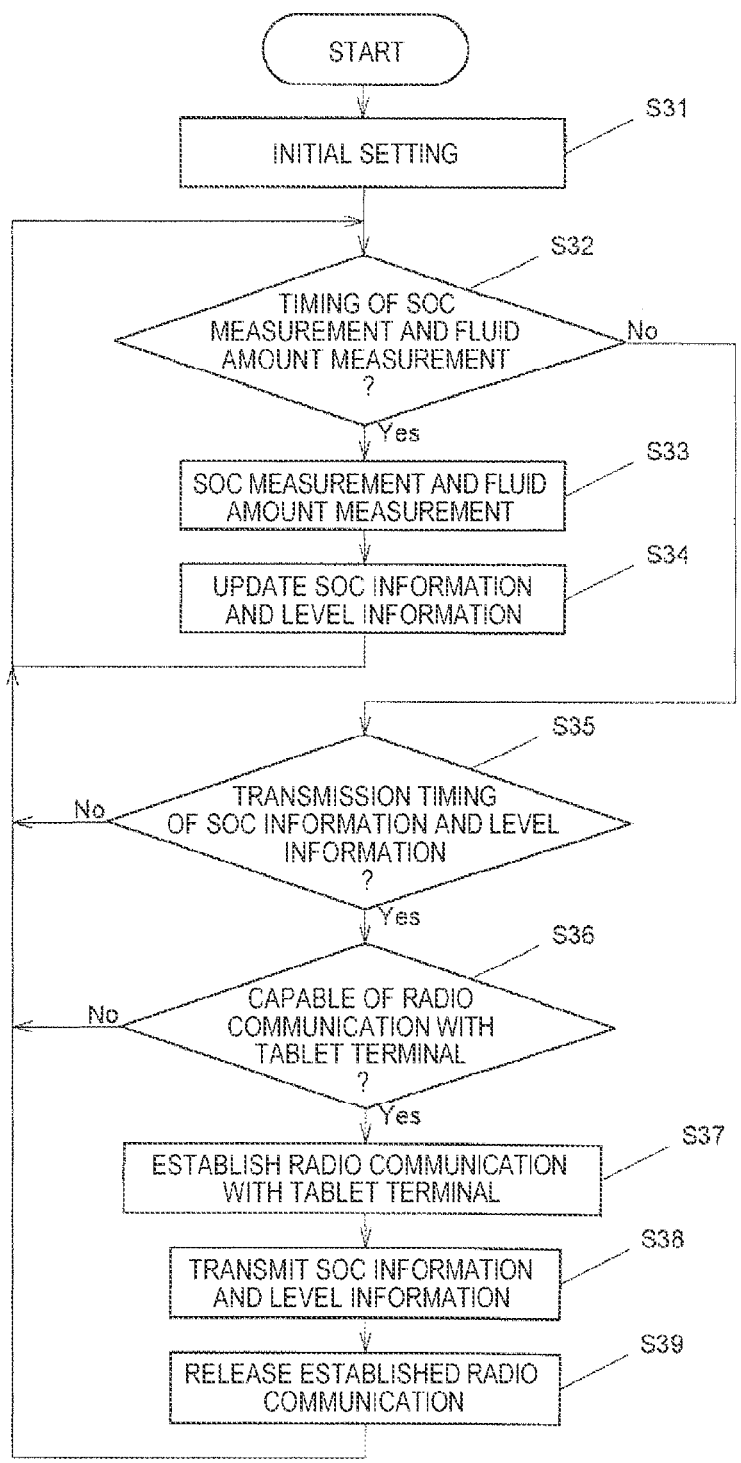
FIG. 11 is a flowchart showing a processing operation of a microprocessor of an in-vehicle diagnostic unit mounted in a cart according to the modified embodiment.

FIG. 11 is a flowchart showing an operation relating to acquisition of SOC information and level information in the microprocessor 16 of the in-vehicle diagnostic unit 10.

When the microprocessor 16 starts its operation, firstly initial setting necessary for the radio communication unit 13, etc. is performed in step S31.

Then, in step S32, it is determined whether or not a timing of SOC measurement and fluid amount measurement to be performed at every predetermined constant period (3 minutes in this embodiment) has arrived. When it is determined that the SOC measurement and fluid amount measurement timing has arrived (Yes), the processing proceeds to step S33. In contrast, when it is determined that the SOC measurement and fluid amount measurement timing has not arrived yet (No), the processing proceeds to step S35.

In step S33, a charge state (SOC) and an amount of the battery fluid of the battery BT of the cart EV mounting the in-vehicle diagnostic unit 10 are measured using the SOC measuring unit 12 and the fluid amount sensor 40, respectively.

Next, in step S34, SOC information and level information is updated using the measured SOC value and fluid amount thus obtained, respectively. When step S34 terminates, the processing returns to step S32. In this manner, SOC measurement and fluid amount measurement of the battery fluid of the battery BT are performed with the constant period (every 3 minutes).

In contrast, when the determination is made No in step S32 and the processing proceeds to step S35, it is determined whether or not a timing of transmission of SOC information and level information to be performed at every predetermined constant period (5 minutes in this embodiment) has arrived. When it is determined that the transmission timing of SOC information and level information has arrived (Yes), the processing proceeds to step S36. In contrast, when it is determined that the transmission timing of SOC information and level information has not arrived yet (No), the processing returns to step S32.

In step S36, it is confirmed whether or not radio communication is capable with the tablet terminal 20. When radio communication is capable with the tablet terminal 20 (Yes), the processing proceeds to step S37. In contrast, when radio communication cannot be performed with the tablet terminal 20 (No), the processing returns to step S32.

In step S37, radio communication is established with the tablet terminal 20, and SOC information and level information is transmitted to the tablet terminal 20 in succeeding step S38. The tablet terminal 20 stores SOC information and level information thus transmitted for each of the cart EVs.

Then, the processing proceeds to step S39, in which the established radio communication is released. Then, the processing returns to step S32, and the processing of step 32 and the succeeding steps are repeated.

In this manner, SOC information and level information of each of the cart EVs is transmitted to and stored in the tablet terminal 20.

Next, an operation of the tablet terminal 20 will be explained in detail with reference to FIGS. 12 and 13.

Figure 12:
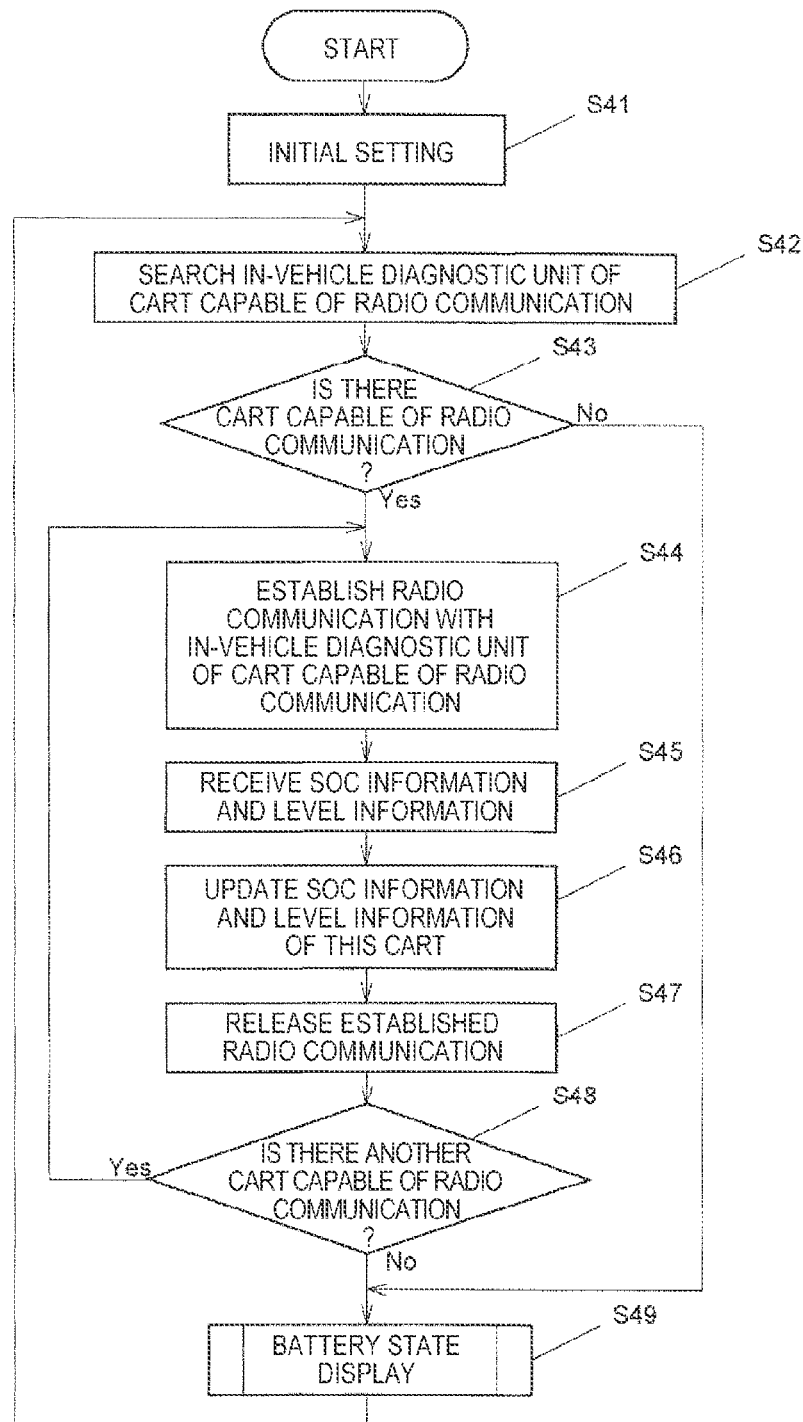
FIG. 12 is a flowchart showing a processing operation of a microprocessor of the tablet terminal according to the modified embodiment.
Figure 13:
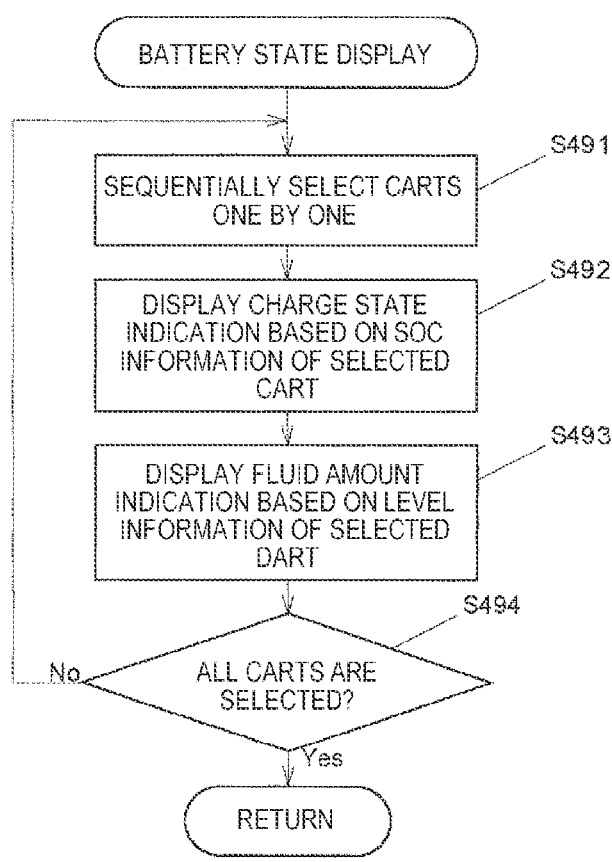
FIG. 13 is a flowchart showing a battery state display routine of the processing operation of the microprocessor of the tablet terminal according to the modified embodiment.

FIG. 12 is a flowchart showing an operation relating to the battery state indication in the microprocessor 26 of the tablet terminal 20.

When the microprocessor 26 starts its operation, firstly initial setting of the radio communication unit 23 is performed in step S41.

Then, the processing proceeds to step S42, in which searching is performed as to the radio communication unit 13 of the in-vehicle diagnostic unit 10 of the cart EV capable of radio communication with the radio communication unit 23 of the tablet terminal.

Next, in step S43, it is determined based on the search result in step S42 whether or not there is the cart EV (the radio communication unit 13 of the in-vehicle diagnostic unit 10) capable of radio communication. When there is the cart EV capable of radio communication (Yes), the processing proceeds to step S44. In contrast, when there is no cart EV capable of radio communication (No), the processing proceeds to step S49.

In step S44, radio communication is established with the radio communication unit 13 of the in-vehicle diagnostic unit 10 of the cart EV capable of radio communication.

Next, the processing proceeds to step S45, in which SOC information and level information of the cart EV mounting the in-vehicle diagnostic unit 10 established radio communication is received. Then, in succeeding step S46, SOC information and level information stored in the tablet terminal 20 is updated using the SOC information and level information thus received.

Next, the processing proceeds to step S47, in which the established radio communication is released.

In succeeding step S48, it is confirmed based on the search result in step S42 whether or not there is another cart EV (the radio communication unit 13 of the in-vehicle diagnostic unit 10) capable of radio communication. When there is another cart EV capable of radio communication (Yes), the processing returns to step S44. In contrast, when there is not any other cart EV capable of radio communication (No), the processing proceeds to step S49.

In step S49, a battery state display routine described later is executed. Then, the processing returns to step S42, and the processing of step S42 and the succeeding steps are repeated.

Next, the battery state display routine of step S49 in FIG. 12 will be explained with reference to FIG. 13.

Firstly, in step S491, the cart EVs storing SOC information and level information of the cart EVs are sequentially selected one by one.

Next, in step S492, the charge state indication 132 of the battery state indication 131 of the selected cart EV is displayed on the display screen 130 of the liquid crystal display 28 based on SOC information of the selected cart EV. That is, like the aforesaid embodiment, the charge state indication 132 of the image of corresponding one of green, yellow and red is displayed based on the SOC information.

Next, in step S493, the fluid amount indication 133 of the battery state indication 131 of the selected cart EV is displayed based on level information of the selected cart EV. That is, as the fluid amount indication 133, the image of the fluid amount level indication (vessel mark) representing a corresponding level of the battery fluid is displayed based on the level information, for each of the cart EVs.

Then, the processing proceeds to step S494, in which it is determined whether or not all the cart EVs are selected. When all the cart EVs are not selected (No), the processing returns to step S491, and the processing of step 491 and the succeeding steps are repeated. In contrast, when all the cart EVs are selected (Yes), this battery state display routine is terminated and the processing returns to step S42 of FIG. 12.

In this modified embodiment, the SOC measuring unit 12 of the in-vehicle diagnostic unit 10 corresponds to the SOC information acquisition unit, and the fluid amount sensor 40 corresponds to the fluid amount information acquisition unit and a level information acquisition unit. The microprocessor 16 of the in-vehicle diagnostic unit 10 executing steps S33 to S34 also correspond to the SOC information acquisition unit, the fluid amount information acquisition unit and the level information acquisition unit. Further, the radio communication unit 13 of the in-vehicle diagnostic unit 10 and the microprocessor 16 of the in-vehicle diagnostic unit 10 executing step S38 correspond to the radio transmission unit.

The microprocessor 26 of the tablet terminal 20 executing step S49 (battery state display routine) corresponds to a battery state display unit. Of the battery state display unit, the microprocessor 26 executing step S493 corresponds to a fluid amount level display unit.

In this manner, in the cart information display system 1A according to the modified embodiment, the fluid amount level indication (vessel mark) representing a corresponding level of the battery fluid is displayed as the fluid amount indication 133. Thus, a corresponding level representing an amount of the battery fluid can be notified easily for each of the cart EVs to the manager.

Although the invention is explained as to the cart information display systems 1, 1A according to the aforesaid embodiment and the modified embodiment, it will be apparent that the invention is not limited to the aforesaid embodiment and modified embodiment, and these embodiments may be changed and applied suitably within a range not departing from the gist of the invention.

For example, each of the aforesaid embodiment and the modified embodiment shows a case that the tablet terminal 20 (display terminal) directly receives SOC information and level information from the in-vehicle diagnostic unit 10 of each of the cart EVs (electric vehicles) capable of radio communication.

However, there is a case that it is difficult for the cart EV to directly perform radio communication with the tablet terminal 20 due to such a situation that this cart EV locates away from the tablet terminal 20. Even in such the case, the system may be arranged in a manner that SOC information, etc. acquired by the in-vehicle diagnostic unit 10 of this cart EV is relayed by the in-vehicle diagnostic unit 10 of another cart EV capable of radio communication so that the tablet terminal 20 can directly or indirectly acquire SOC information, etc. of each of the cart EVs. Further, the system may contain a plurality of the tablet terminals 20 (display terminals).

In a case of acquiring SOC information via radio communication, the system is not limited to the aforesaid system in which the tablet terminal 20 (display terminal) acquires SOC information or both SOC information and fluid amount information via radio communication from the in-vehicle diagnostic unit 10 of each of the cart EVs. For example, the system may be arranged to include a base station which performs radio communication directly with the in-vehicle diagnostic unit 10 of each of the cart EVs or indirectly therewith via the in-vehicle diagnostic unit 10 of another of the cart EVs; and then transfers SOC information, etc. transmitted thereto from the in-vehicle diagnostic unit 10 of each of the cart EVs to the tablet terminal 20.

In the aforesaid embodiment, the fluid replenishment necessity indication 33A (fluid droplet mark) is displayed in a case of replenishment necessity of the battery fluid. In contrast, in a case of replenishment unnecessity of the battery fluid, the fluid replenishment unnecessity indication 33B is displayed, that is, the fluid droplet mark is not displayed (transmission display). However, an image representing replenishment unnecessity may be designed separately as the fluid replenishment unnecessity indication so as to be discriminable from the fluid replenishment necessity indication, and this fluid replenishment unnecessity indication may be displayed in a case of replenishment unnecessity.

Further, in the aforesaid embodiment, the fluid droplet mark urging replenishment of the battery fluid is merely displayed as the fluid replenishment necessity indication 33A representing replenishment necessity of the battery fluid. The fluid replenishment necessity indication 33A may be arranged to change its color with time or to blink. Alternatively, the fluid replenishment necessity indication may be arrange to change its color with time or to blink in a case that the battery fluid is not replenished even if a predetermined time elapses after the first display of the fluid replenishment necessity indication.

Further, in the aforesaid embodiment, the battery state indication 31 is displayed in a manner that the fluid amount indication 33 (fluid droplet mark) is partially overlapped with the charge state indication 32. Further, in the modified embodiment, the battery state indication 131 is displayed in a manner that the charge state indication 132 and the fluid amount indication 133 are displayed separately. However, a single battery state indication configured by integrating a charge state indication and a fluid amount indication may be used.

Figure 14:
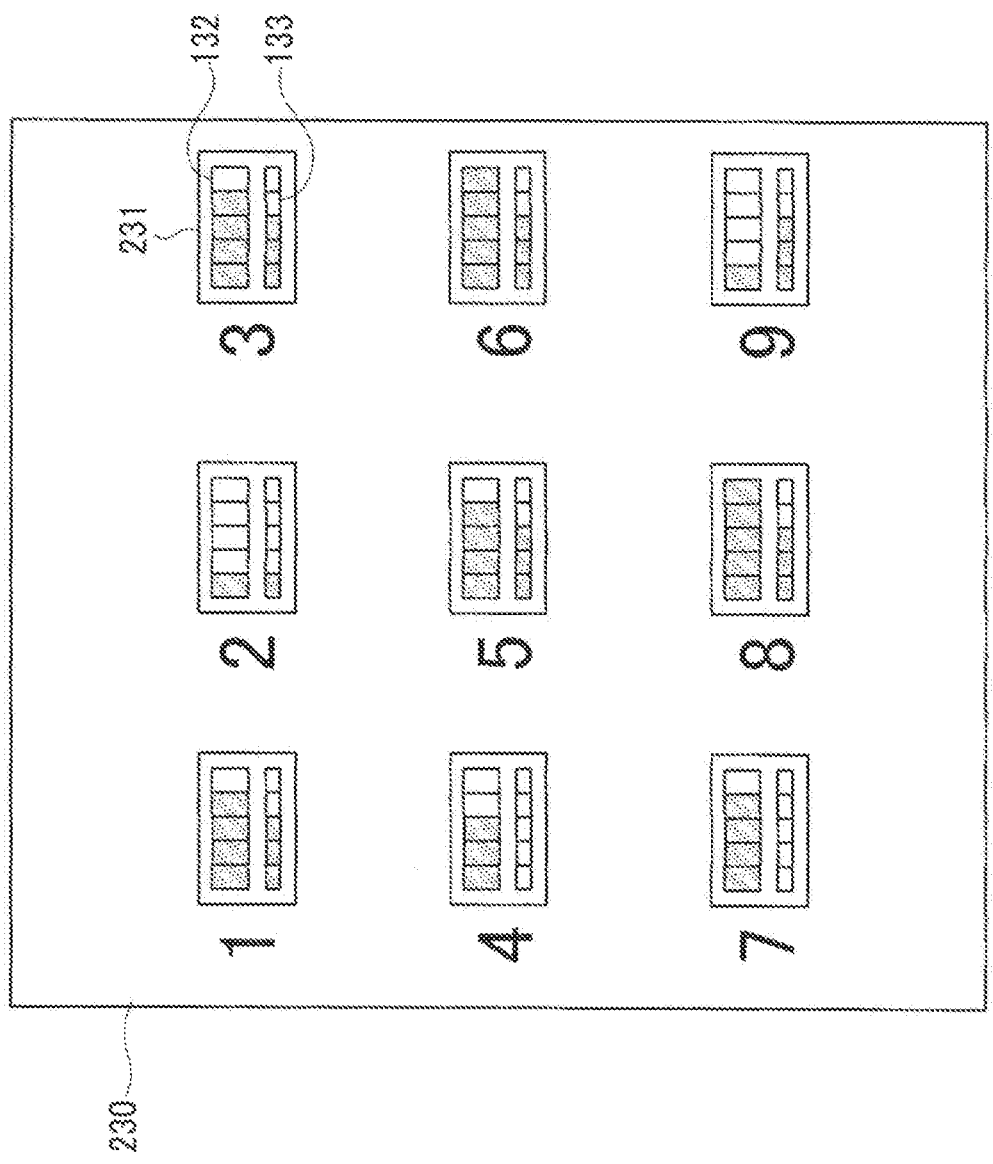
FIG. 14 is an explanatory diagram showing a modified example of the display screen of the tablet terminal according to the modified embodiment.

For example, FIG. 14 is a modified example of the battery state indication 131 of the modified embodiment. In a display screen 230 of this modified example, a single battery state indication 231 is used which is configured by integrating a charge state indication 232, as a level indicator representing one of plural discrete levels corresponding to a charge state (SOC) of the battery BT, and a fluid amount indication 233, as a level indicator representing one of plural discrete levels corresponding to an amount of the battery fluid.

FIG. 2

12 SOC measuring unit
13 radio communication unit
16 microprocessor

FIG. 3

23 radio communication unit
26 microprocessor
28 liquid crystal display

FIG. 5 start
S1 initial setting
S2 SOC measurement timing?
S3 SOC measurement
S4 update SOC information
S5 SOC information transmission timing?
S6 capable of radio communication with tablet terminal?
S7 establish radio communication with tablet terminal
S8 transmit SOC information
S9 release established radio communication

FIG. 6 start
S11 initial setting
S12 search in-vehicle diagnostic unit of cart capable of radio communication
S13 is there cart capable of radio communication?
S14 establish radio communication with in-vehicle diagnostic unit of cart capable of radio communication
S15 receive SOC information
S16 update SOC information of this cart
S17 release established radio communication
S18 is there another cart capable of radio communication?
S19 acquire necessity/unnecessity information
S20 battery state display

FIG. 7 touch panel input operation interruption
S21 input operation of replenishment completion of battery fluid by worker?
S22 acquire cart No. subjected to input operation
S23 update most recent replenishment date/time of this cart
return

FIG. 8 acquisition of necessity/unnecessity information
S191 sequentially select carts one by one
S192 first time period T1 elapses after most recent replenishment date/time?
S193 necessity/unnecessity information←replenishment necessity
S194 necessity/unnecessity information←replenishment unnecessity
S195 all carts are selected?
return

FIG. 9 battery state display
S201 sequentially select carts one by one
S202 display battery state indication based on SOC information of selected cart
S203 necessity/unnecessity information of selected cart EV is replenishment necessity?
S204 display fluid droplet mark
S205 not display fluid droplet mark
S206 all carts are selected?
return

FIG. 11 start
S31 initial setting
S32 timing of SOC measurement and fluid amount measurement?
S33 SOC measurement and fluid amount measurement
S34 update SOC information and level information
S35 transmission timing of SOC information and level information?
S36 capable of radio communication with tablet terminal?
S37 establish radio communication with tablet terminal
S38 transmit SOC information and level information
S39 release established radio communication

FIG. 12 start
S41 initial setting
S42 search in-vehicle diagnostic unit of cart capable of radio communication
S43 is there cart capable of radio communication?
S44 establish radio communication with in-vehicle diagnostic unit of cart capable of radio communication
S45 receive SOC information and level information
S46 update SOC information and level information of this cart
S47 release established radio communication
S48 is there another cart capable of radio communication?
S49 battery state display

FIG. 13 battery state display
S491 sequentially select carts one by one
S492 display charge state indication based on SOC information of selected cart
S493 display fluid amount indication based on level information of selected dart
S494 all carts are selected?
return

What is claimed is:

1. A battery state display system comprising:
a plurality of electric vehicles, each of the plurality of electric vehicles being configured to be driven by a battery containing battery fluid; and
a display terminal comprising:
a communication unit configured to communicate with the plurality of electric vehicles;
a display configured to display an image including a state of the battery of each of a plurality of electric vehicles on the display of the display terminal; and,
a processor configured to:
control the display terminal to display on the display a battery state indication for each of the electric vehicles, the battery state indication including:
a charge state indication representing a charge state of the battery; and
a fluid amount indication relating to an amount of the battery fluid of the battery.

2. The battery state display system according to claim 1, wherein
each of the electric vehicles includes:
a SOC information acquisition unit configured to acquire SOC information relating to the charge state of the electric vehicle; and
a radio transmission unit configured to transmit the SOC information by radio communication, and
the communication unit of the display terminal receives the SOC information, and
the processor of the display terminal displays the charge state indication based on the received SOC information.

3. The battery state display system according to claim 2, wherein
the controller of the display terminal is configured to acquire, for each of the electric vehicles, fluid amount information relating to the amount of battery fluid, and display the fluid amount indication based on the fluid amount information.

4. The battery state display system according to claim 3, wherein
the processor is configured to acquire necessity/unnecessity information representing replenishment necessity or replenishment unnecessity of the battery fluid as the fluid amount information, and
display, based on the necessity/unnecessity information, a fluid replenishment necessity indication representing the replenishment necessity of the battery fluid or a fluid replenishment unnecessity indication representing the replenishment unnecessity of the battery fluid, as the fluid amount indication, for each of the electric vehicles.

5. The battery state display system according to claim 4, wherein
the processor is configured to set the necessity/unnecessity information to the replenishment necessity in a case that a predetermined first time period elapses after date/time at which the battery fluid is replenished most recently as to the electric vehicle, and set the necessity/unnecessity information to the replenishment unnecessity in a case that the predetermined first time period does elapse yet.

6. The battery state display system according to claim 3, wherein
the processor is configured to:
acquire level information representing an amount of the battery fluid as the fluid amount information, for each of the electric vehicles, and
display, based on the level information, a fluid amount level indication representing a level of an amount of the battery fluid as the fluid amount indication, for each of the electric vehicles.

7. A display terminal comprising:
a communication unit configured to communicate with a plurality of electric vehicles, each of the plurality of electric vehicles being configured to be driven by a battery containing battery fluid;
a display configured to display an image including a state of the battery of each of a plurality of electric vehicles on the display of the display terminal; and
a processor configured to:
control the display terminal to display on the display a battery state indication for each of the electric vehicles, the battery state indication including:
a charge state indication representing a charge state of the battery; and
a fluid amount indication relating to an amount of the battery fluid of the battery.

8. The display terminal according to claim 7, wherein
each of the electric vehicles includes:
a SOC information acquisition unit configured to acquire SOC information relating to the charge state of the electric vehicle; and
a radio transmission unit configured to transmit the SOC information by radio communication, and
the communication unit of the display terminal receives the SOC information, and
the processor of the display terminal displays the charge state indication based on the received SOC information.

9. The display terminal according to claim 8, wherein
the controller of the display terminal is configured to:
acquire, for each of the electric vehicles, fluid amount information relating to the amount of battery fluid, and
display the fluid amount indication based on the fluid amount information.

10. The display terminal according to claim 9, wherein
the processor is configured to acquire necessity/unnecessity information representing replenishment necessity or replenishment unnecessity of the battery fluid as the fluid amount information, and display, based on the necessity/unnecessity information, a fluid replenishment necessity indication representing the replenishment necessity of the battery fluid or a fluid replenishment unnecessity indication representing the replenishment unnecessity of the battery fluid, as the fluid amount indication, for each of the electric vehicles.

11. The display terminal according to claim 10, wherein the processor is configured to set the necessity/unnecessity information to the replenishment necessity in a case that a predetermined first time period elapses after date/time at which the battery fluid is replenished most recently as to the electric vehicle, and set the necessity/unnecessity information to the replenishment unnecessity in a case that the predetermined first time period does elapse yet.

12. The display terminal according to claim 9, wherein the processor is configured to:

acquire level information representing an amount of the battery fluid as the fluid amount information, for each of the electric vehicles, and display, based on the level information, a fluid amount level indication representing a level of an amount of the battery fluid as the fluid amount indication, for each of the electric vehicles.

\* \* \* \* \*